United States Patent
Kim

(10) Patent No.: US 6,624,673 B2
(45) Date of Patent: Sep. 23, 2003

(54) CIRCUIT FOR RESETTING A MICROCONTROLLER

(75) Inventor: Kye-Joo Kim, Anyang (KR)

(73) Assignee: Samsung Electronics, Co., Ltd., Suwon (KR)

(*) Notice: Subject to any disclaimer, the term of this patent is extended or adjusted under 35 U.S.C. 154(b) by 0 days.

(21) Appl. No.: 09/994,437

(22) Filed: Nov. 27, 2001

(65) Prior Publication Data

US 2002/0180497 A1 Dec. 5, 2002

(30) Foreign Application Priority Data

Apr. 26, 2001 (KR) ........................... 2001-22546

(51) Int. Cl.[7] ............................................. H03L 7/00
(52) U.S. Cl. ......................................... 327/143
(58) Field of Search ................................. 327/143, 198

(56) References Cited

U.S. PATENT DOCUMENTS 5,968,178 A * 10/1999 Williams et al. ............ 327/143

FOREIGN PATENT DOCUMENTS

KR   2001019864 A  *  3/2001  ............. G06F/1/24

* cited by examiner

Primary Examiner—Terry O. Cunningham
Assistant Examiner—Quan Tra
(74) Attorney, Agent, or Firm—F. Chau & Associates, LLP

(57) ABSTRACT

A low voltage detector is provided which detects whether a power supply voltage falls below a predetermined threshold voltage. In accordance with the present invention, the low voltage detector is enabled or disabled with an operating state of a microcontroller. If the microcontroller enters into a halt mode in which the microcontroller does not operate, current flowing to the low voltage detector is cut off. During the halt mode of the microcontroller, the low voltage detector does not consume power, thereby reducing overall power consumption.

17 Claims, 3 Drawing Sheets

CIRCUIT FOR RESETTING A MICROCONTROLLER

This application claims priority to Korean Patent Application No. 2001-22546, filed on Apr. 26, 2001, the contents of which are herein incorporated by reference in their entirety.

FIELD OF THE INVENTION

The present invention generally relates to integrated circuit devices and, more specifically, to a circuit for resetting a microcontroller.

BACKGROUND OF THE INVENTION

Portable electronic devices such as notebook computers, personal digital assistants (PDA), cellular phones, portable CD players, etc., occasionally undergo such a state that a power supply voltage exceeds or falls below an operating voltage range. Such portable electronic devices usually include a microcontroller. When the power supply voltage applied to the microcontroller deviates from an operating voltage range, the microcontroller can be in an unknown state, thus causing unpredictable behavior.

Various approaches have been developed to solve such a problem. One known approach includes using a low voltage detector in a portable electronic device. The low voltage detector incorporated in the electronic device senses or detects whether the power supply voltage falls below a predetermined threshold voltage, and then outputs a signal for resetting or halting the microcontroller, thereby preventing the microcontroller from malfunctioning. After the microcontroller enters the halt state, if the power supply voltage is gradually increased and reaches the predetermined threshold voltage, the low voltage detector generates a pulse signal to reset the microcontroller.

In general, the low voltage detector always senses or detects the power supply voltage regardless of an operating state of the microcontroller. Even though the microcontroller is in a stop or halt mode, in which the microcontroller does not operate, the low voltage detector continues to sense or detect whether the power supply voltage deviates from the predetermined threshold voltage. This means that unnecessary power for the low voltage detector continues to be consumed during the microcontroller stop or halt mode. Thus, it is desirable to minimize unnecessary power consumption for the electronic devices.

SUMMARY OF THE INVENTION

It is therefore an object of the present invention to provide a circuit for resetting a microcontroller capable of preventing the circuit from consuming power when the microcontroller enters into a halt mode.

According to an aspect of the present invention, there is provided a circuit for resetting a microcontroller. The circuit comprises a low voltage detector that is configured to be supplied with current from a current source and detects whether a power supply voltage falls below a predetermined threshold voltage. The circuit further comprises means for detecting whether the microcontroller enters into a non-operating state. When the microcontroller enters into the non-operating state, the means for detecting controls the current source so that no current is supplied to the low voltage detector. The means for detecting comprises an S-R flip-flop that has a set input terminal connected to receive an interrupt signal, a reset terminal connected to receive a halt signal indicating whether the microcontroller operates normally, and an output terminal. When the interrupt signal is activated an output of the S-R flip-flop is set so the current source supplies a current to the low voltage detector. When the halt signal is activated an output of the S-R flip-flop is reset so that no current flows from the current source to the low voltage detector.

According to another aspect of the present invention, a circuit is provided which generates a reset signal for resetting a microcontroller. The circuit comprises a first detector, a second detector, a current source, and a signal generator. The first detector detects whether the microcontroller enters into a halt mode in which the microcontroller does not operate. The second detector detects whether a power supply voltage falls below a predetermined threshold voltage. The current source supplies a current to the second detector in response to an output of the first detector. The signal generator produces the reset signal in response to the output of the first detector and an output of the second detector. When the microcontroller enters into the halt mode the current source is disabled so as to cut off a current from the current source to the second detector. The current source comprises an NMOS transistor having a drain connected to the power supply voltage, a source connected to the second detector, and a gate connected to receive an output of the first detector. A delay is further provided which delays an output of the first detector to apply the delayed output to the gate of the NMOS transistor. The first detector comprises an S-R flip-flop that has a set input terminal connected to receive an interrupt signal, a reset input terminal connected to receive a halt signal indicating whether the microcontroller operates normally, and an output terminal. The signal generator comprises an AND gate that has a first input terminal connected to receive an output of the first detector, a second input terminal connected to receive an output of the second detector, and an output terminal for outputting the reset signal.

According to another aspect of the prevent invention, a method is provided which resets a microcontroller that is comprised in an integrated circuit device having a low voltage detector for detecting whether a power supply voltage falls below a predetermined threshold voltage. The method comprises the steps of detecting whether the microcontroller enters into a halt mode in which the microcontroller does not operate; enabling the low voltage detector when the microcontroller does not enter into the halt mode; and disabling the low voltage detector when the microcontroller enters into the halt mode, wherein the disabled low voltage detector is enabled when an external device generates an interrupt signal.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF PREFERRED EMBODIMENTS

Figure 1:
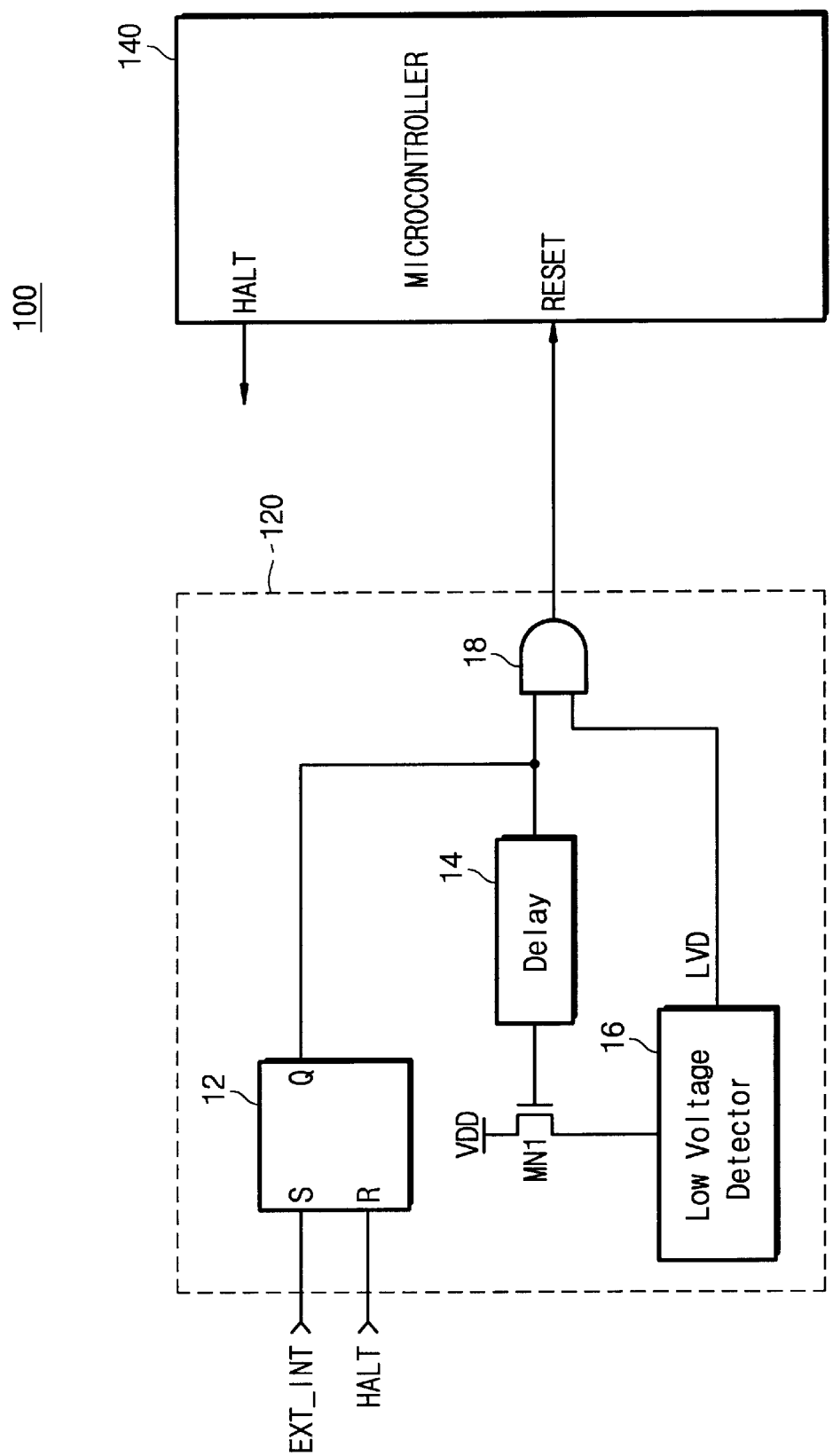
FIG. 1 is a block diagram showing an integrated circuit device including a low voltage detector block according to the present invention.
Figure 2:
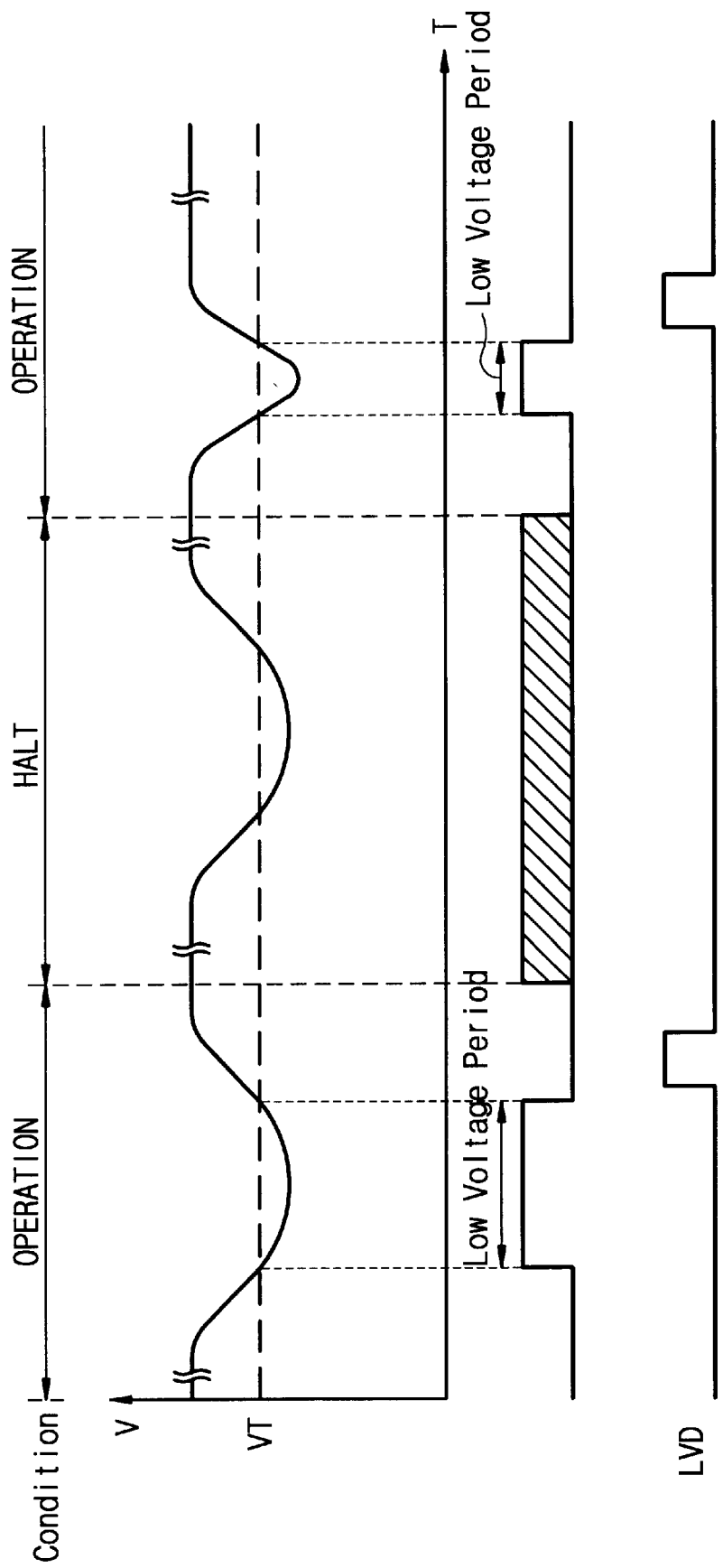
FIG. 2 is a timing diagram for describing operations of a low voltage detector block illustrated in FIG. 1.

Hereinafter, a preferred embodiment of the present invention will be described in detail with reference to accompanying drawings. However, the embodiments of the present invention may be modified into various other forms, and the scope of the present invention must not be interpreted as being restricted to the embodiments. The embodiments are provided to more completely explain the present invention to those skilled in the art FIG. 1 shows an integrated circuit device comprising a low voltage detector block according to the present invention. FIG. 2 is a timing diagram for describing an operation of a low voltage detector block illustrated in FIG. 1. Referring to FIG. 1, the integrated circuit device 100 according to a preferred embodiment of the present invention includes a low voltage detector block 120 as a reset signal generating circuit and a microcontroller 140. The low voltage detector block 120 includes a low voltage detector 16 for detecting whether a power supply voltage falls below a predetermined threshold voltage. The low voltage detector 16 is enabled or disabled according to an operating state of the microcontroller 140, which will be more fully described below.

The low voltage detector block 120 includes a set-reset flip-flop (S-R flip-flop) 12, a delay 14, an NMOS transistor MN1, and an AND gate 18. The S-R flip-flop 12 has a set input terminal S connected to an external interrupt signal EXT_INT to receive the external interrupt signal EXT_INT, a reset input terminal R to receive a halt signal HALT, and an output terminal Q. The output signal of the S-R flip-flop 12 is applied to a gate of the NMOS transistor MN1 through the delay 14, and applied to the AND gate 18. The NMOS transistor MN1 is connected between a power supply voltage VDD and the low voltage detector 16 and is switched on/off according to an output signal of the delay 14. That is, the NMOS transistor MN1 acts as a current source which is controlled according to an operating state of the microcontroller 140. The AND gate 18 receives the output signal of the S-R flip-flop 12 and an output signal LVD of the low voltage detector 16, and generates a reset signal to be applied to the microcontroller 140.

The external interrupt signal EXT_INT is a signal provided from one or more peripheral function blocks associated with the microcontroller 140. The halt signal HALT is a signal provided from the microcontroller 140.

For example, when the microcontroller 140 is changed to a halt mode from an operation mode, the halt signal HALT is activated to have a logic high level. When the microcontroller 140 operates normally, the halt signal HALT has a logic low level. The halt mode includes a stop mode and an idle mode that are well known to ones skilled in the art. The delay 14 is to prevent the low voltage detector 16 from operating unstably owing to an external noise or a variation of the power supply voltage VDD.

In operation, when the interrupt signal EXT_INT is changed from the logic low level to the logic high level, the S-R flip-flop 12 generates an output signal of a logic high level, so that the NMOS transistor MN1 is turned on so as to supply the low voltage detector 16 with a current or the power supply voltage VDD. The low voltage detector 16 detects whether the power supply voltage VDD falls below a threshold voltage VT. If the power supply voltage VDD is higher than the threshold voltage VT, an output signal LVD of the low voltage detector 16 maintains the logic low level. Thus, an output signal RESET of the AND gate 18 maintains the logic low level. If the power supply voltage VDD falls below the threshold voltage VT, an oscillator (not shown) of the microcontroller 140 is stopped so as for the microcontroller 140 not to operate. And then, when the power supply voltage VDD increases and reaches the threshold voltage VT, as shown in FIG. 2, the output signal LVD of the low voltage detector 16 is activated to have a logic high level. This makes the output signal RESET of the AND gate 18 change from the logic low level to the logic high level. Accordingly, the microcontroller 140 is reset by the low-to-high transition of the reset signal RESET.

If the microcontroller 140 is changed into the halt mode in which the microcontroller does not operate, the halt signal HALT is changed from the logic low level to the logic high level. The output signal of the S-R flip-flop 12 is reset to '0' with a low-to-high transition of the halt signal HALT. This makes the NMOS transistor MN1 be turned off. That is, no power supply voltage VDD or current is supplied to the low voltage detector 16. Therefore, the low voltage detector 16 does not consume power during a non-operating state or a halt mode of the microcontroller 140.

In the event that the power supply voltage VDD falls below the threshold voltage VT at a non-operating state of the microcontroller 140, the microcontroller 140 does not operate erroneously. This is because the microcontroller 140 is changed into the halt mode. In this case, although the power supply voltage VDD is increased over the threshold voltage VT, the output signal RESET of the AND gate 18 is not activated because the output signal of the S-R flip-flop 12 is at a logic low level. Therefore, the microcontroller 140 is not reset.

The inactivated or disabled low voltage detector 16 is activated or enabled when the external interrupt signal EXT_INT is changed from the logic low level to the logic high level. As the interrupt signal EXT_INT has a low-to-high transition, the output signal of the S-R flip-flop 12 goes to logic high level (or the S-R flip-flop 12 is set). This enables the low voltage detector 16 to supply the power supply voltage VDD or current. It means that the low voltage detector 16 operates to detect whether the power supply voltage VDD is below the threshold voltage VT. With a detection result of the low voltage detector 16, an operation of the low voltage detector block 120 is identical to that above described.

In the event that the microcontroller 140 is in the halt mode and the power supply voltage VDD is over the threshold voltage VT, if the external interrupt signal EXT_INT is changed to a logic high level, the low voltage detector 16 is enabled. This makes an oscillator (not shown) in the microcontroller 140 operate. Accordingly, the microcontroller 140 operates normally. On the other hand, in the event that the microcontroller 140 is in the halt mode and the power supply voltage VDD is below the threshold voltage VT, if the external interrupt signal EXT_INT is activated to have a logic high level, the low voltage detector 16 is enabled. Though the low voltage detector 16 is enabled, the microcontroller 140 continues to maintain the halt mode because the power supply voltage VDD is below the threshold voltage VT.

Power consumption of the low voltage detector is summarized in a following table.

TABLE

| | VDD condition | Low Voltage Detector | LVD | Power consumption |
|---|---|---|---|---|
| HALT = 'L' | VDD > VT | Operating | LOW | Consumed |
| | VDD ≤ VT | Operating | HIGH | Consumed |
| HALT = 'H' | VDD > VT | Not operating | — | Not consumed |
| | VDD ≤ VT | Not operating | — | Not consumed |

As shown in the above table, the low voltage detector 16 operates or does not operate according to whether the microcontroller 140 operates (HALT='L') or does not operate (HALT='H'). Therefore, when the microcontroller 140 is at a non-operating state, the low voltage detector 16 is prevented from consuming unnecessary current. In general, the microcontroller 140 is reset: 1) when a power is on; 2) when a power supply voltage falls below a predetermined threshold voltage; and 3) when a reset signal is generated by a well-known watchdog timer every predetermined time.

Figure 3:
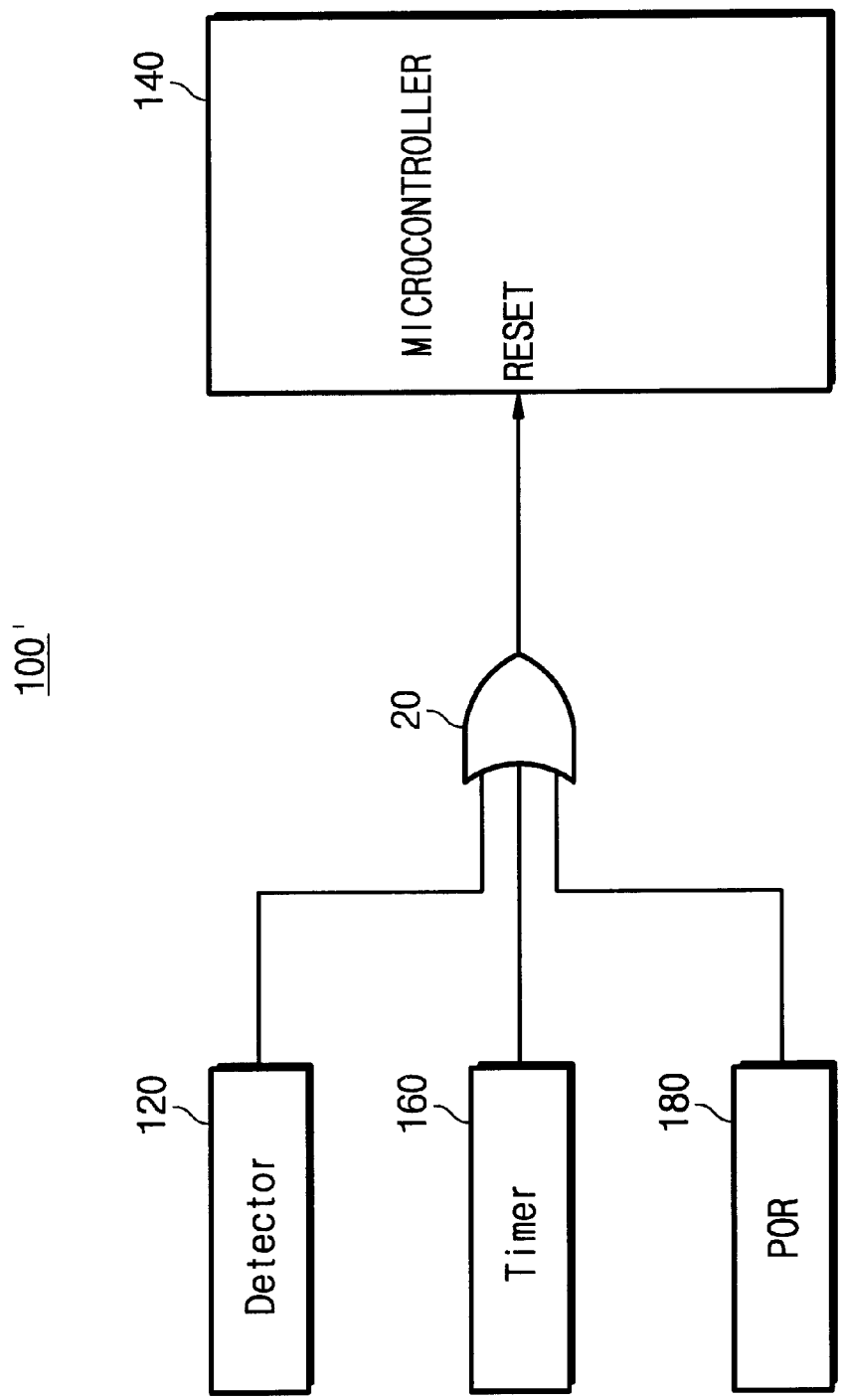
FIG. 3 is a block diagram showing a modified integrated circuit device according to another embodiment of the present invention.

Referring to FIG. 3, a circuit for resetting a microcontroller 140 according to another embodiment of the present invention further includes a low voltage detector block 120, a watchdog timer 160, a power-on reset circuit 180, and an OR gate 20. The OR gate 20 receives output signals of the low voltage detector block 120, the watchdog timer 160, and the power-on reset circuit 180, and generates a reset signal RESET when one of the received signals is activated to have a logic high level. The low voltage detector block 120 is substantially identical with that illustrated in FIG. 1. The watchdog timer 160 executes a particular diagnostic routine. If the particular diagnostic routine being executed takes longer to execute than a certain maximum expected execution time, the watchdog timer 160 expires and sends an interrupt (a logic high level) to the OR gate 20. The power-on reset circuit 180 outputs a pulse (a logic high level) of given width upon power on. Detailed explanations of a watchdog timer 160 and a power-on reset circuit 180 can be found in U.S. Pat. No. 5,513,319 entitled "WATCHDOG TIMER FOR COMPUTER SYSTEM RESET". and U.S. Pat. No. 5,485,111 entitled "POWER ON RESET CIRCUIT WITH ACCURATE DETECTION AT LOW VOLTAGES", respectively. Therefore, a low voltage detector 120 does not consume current when the microcontroller 140 is changed into a halt mode.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A circuit for resetting a microcontroller comprising:
   a current source;
   a low voltage detector configured to be supplied with a current from the current source, for detecting whether a power supply voltage falls below a predetermined threshold voltage; means for detecting whether the microcontroller changes to a non-operating state, wherein when the microcontroller changes to the non-operating state, the
   means for detecting controls the current source so that no current is supplied to the low voltage detector; and
   a delay for delaying an output of the means for detecting to delay the controlling of the current source.

2. The circuit according to claim 1, wherein the means for detecting comprises a set-reset flip-flop (S-R flip-flop) having a set input terminal connected to an interrupt signal to receive the interrupt signal, a reset terminal connected to a halt signal to receive the halt signal indicating whether the microcontroller operates normally, and an output terminal.

3. The circuit according to claim 2, wherein when the interrupt signal is activated, an output of the S-R flip-flop is set so that the current source supplies a current to the low voltage detector.

4. The circuit according to claim 2, wherein when the halt signal is activated, an output of the S-R flip-flop is reset so that no current flows from the current source to the low voltage detector.

5. A circuit for generating a reset signal for resetting a microcontroller comprising:
   a first detector for detecting whether the microcontroller changes to a halt mode in which the microcontroller does not operate;
   a second detector for detecting whether a power supply voltage falls below a predetermined threshold voltage;
   a current source for supplying a current to the second detector in response to an output of the first detector;
   a delay for delaying an output of the first detector to apply the delayed output to the current source; and
   a signal generator for generating the rest signal in response to the output of the first detector and an output of the second detector, wherein when the microcontroller changes to the halt mode, the current source is disabled so as to cut off a current from the current source to the second detector.

6. The circuit according to claim 5, wherein the current source comprises an NMOS transistor having a drain connected to the power supply voltage, a source connected to the second detector, and a gate connected to an output of the first detector.

7. A circuit for generating a reset signal for resetting a microcontroller comprising:
   a first detector for detecting whether the microcontroller changes to a halt mode in which the microcontroller does not operate;
   a second detector for detecting whether a power supply voltage falls below a predetermined threshold voltage;
   a current source for supplying a current to the second detector in response to an output of the first detector, the current source comprising an NMOS transistor having a drain connected to the power supply voltage, a source connected to the second detector, and a gate connected to an output of the first detector;
   a delay for delaying an output of the first detector to apply the delayed output to the gate of the NMOS transistor; and
   a signal generator for generating the reset signal in response to the output of the first detector and an output of the second detector, wherein when the microcontroller changes to the halt mode, the current source is disabled so as to cut off a current from the current source to the second detector.

8. The circuit according to claim 5, wherein the first detector comprises an S-R flip-flop having a set input terminal connected to an interrupt signal, a reset input terminal connected to a halt signal indicating whether the microcontroller operates normally, and an output terminal.

9. The circuit according to claim 5, wherein the signal generator comprises an AND gate having a first input terminal connected to an output of the first detector, a second input terminal connected to an output of the second detector, and an output terminal for outputting the reset signal.

10. The circuit according to claim 5, wherein an output of the second detector is activated when the power supply voltage falls below the threshold voltage and then again reaches the threshold voltage.

11. An integrated circuit device comprising:

a microcontroller;

at least one peripheral function block associated with the microcontroller for generating an interrupt signal; and a circuit for resetting the microcontroller, wherein the circuit comprises a first detector for detecting whether the microcontroller changes to a halt mode in which the microcontroller does not operate; a second detector for detecting whether a power supply voltage falls below a predetermined threshold voltage; a current source for supplying a current to the second detector in response to an output of the first detector; and a signal generator for generating the reset signal in response to the output of the first detector and an output of the second detector, wherein when the microcontroller changes to the halt mode, the current source is disabled so as to cut off a current from the current source to the second detector and wherein the current source is enabled upon generation of the interrupt signal.

12. The integrated circuit device according to claim 11, wherein the current source comprises an NMOS transistor having a drain connected to the power supply voltage, a source connected to the second detector, and a gate connected to an output of the first detector.

13. The integrated circuit device according to claim 12, further comprising a delay for delaying an output of the first detector to apply the delay output to the gate of the NMOS transistor.

14. The integrated circuit device according to claim 11, wherein the first detector comprises an S-R flip-flop having a set input terminal connected to an interrupt signal, a reset input terminal connected to a halt signal indicating whether the microcontroller operates normally, and an output terminal.

15. The integrated circuit device according to claim 11, wherein the signal generator comprises an AND gate having a first input terminal connected to an output of the first detector, a second input terminal connected to an output of the second detector, and an output terminal for outputting the reset signal.

16. The circuit according to claim 11, wherein an output of the second detector is activated when the power supply voltage falls below the threshold voltage and then again reaches the threshold voltage.

17. A method for resetting a microcontroller comprising a low voltage detector for detecting whether a power supply voltage falls below a predetermined threshold voltage, the method comprising the steps of:

detecting whether the microcontroller enters into a halt mode in which the microcontroller does not operate;

enabling the low voltage detector when the microcontroller does not change to the halt mode; and disabling the low voltage detector when the microcontroller changes to the halt mode, wherein the disabled low voltage detector is enabled when an external device generates an interrupt signal.

* * * * *